United States Patent
Heng et al.

(10) Patent No.: US 9,960,302 B1
(45) Date of Patent: May 1, 2018

(54) CASCADED PHOTOVOLTAIC STRUCTURES WITH INTERDIGITATED BACK CONTACTS

(71) Applicant: SolarCity Corporation, San Mateo, CA (US)

(72) Inventors: Jiunn Benjamin Heng, Los Altos Hills, CA (US); Peter J. Rive, San Mateo, CA (US); Zhigang Xie, San Jose, CA (US); Bobby Yang, Los Altos Hills, CA (US)

(73) Assignee: Tesla, Inc., Palo Alto, CA (US)

( * ) Notice: Subject to any disclaimer, the term of this patent is extended or adjusted under 35 U.S.C. 154(b) by 0 days. days.

(21) Appl. No.: 15/297,039

(22) Filed: Oct. 18, 2016

(51) Int. Cl.
*H02S 20/25* (2014.01)
*H01L 31/05* (2014.01)
*H01L 31/0224* (2006.01)
*H01L 31/043* (2014.01)

(52) U.S. Cl.
CPC .. *H01L 31/0516* (2013.01); *H01L 31/022458* (2013.01); *H01L 31/043* (2014.12)

(58) Field of Classification Search
CPC . H01L 31/042; H01L 31/048; H01L 31/0504; H01L 31/044; H01L 31/0508; H02S 40/048
USPC ......................................................... 136/244
See application file for complete search history.

(56) References Cited

U.S. PATENT DOCUMENTS

| | | | |
|---|---|---|---|
| 4,239,810 A | 12/1980 | Alameddine | |
| 5,118,540 A | 6/1992 | Hutchison | |
| 5,427,961 A | 6/1995 | Takenouchi | |
| 5,667,596 A | 9/1997 | Tsuzuki | |
| 5,942,048 A | 8/1999 | Fujisaki | |
| 6,133,522 A | 10/2000 | Kataoka | |
| 6,472,594 B1 | 10/2002 | Ichinose | |
| 7,259,321 B2 | 8/2007 | Oswald | |
| 7,276,724 B2 | 10/2007 | Sheats | |
| 7,833,808 B2 | 11/2010 | Xu | |
| 7,851,700 B2 | 12/2010 | Luch | |
| 7,902,451 B2 | 3/2011 | Shimizu | |
| 7,964,440 B2 | 6/2011 | Salleo | |
| 8,206,664 B2 | 6/2012 | Lin | |
| 8,471,141 B2 | 6/2013 | Stancel | |
| 8,674,377 B2 | 3/2014 | Farquhar | |
| 9,150,966 B2 | 10/2015 | Xu | |
| 9,206,520 B2 | 12/2015 | Barr | |

(Continued)

FOREIGN PATENT DOCUMENTS

| CN | 102544380 | 8/2015 |
|---|---|---|
| CN | 103426957 | 3/2016 |

(Continued)

OTHER PUBLICATIONS

Bulucani et al., "A new approach: low cost masking material and efficient copper metallization for higher efficiency silicon solar cells" 2015 IEEE.

(Continued)

*Primary Examiner* — Jayne L Mershon
(74) *Attorney, Agent, or Firm* — Shun Yao; Park, Vaughan, Fleming & Dowler LLP

(57) ABSTRACT

A solar module is provided. The solar module includes a number of photovoltaic structures. Each photovoltaic structure has an interdigitated back contact, and the photovoltaic structures are cascaded, wherein any two adjacent structures are electrically coupled by overlapping their edges.

11 Claims, 12 Drawing Sheets

(56) References Cited

U.S. PATENT DOCUMENTS

| | | |
|---|---|---|
| 9,362,527 B2 | 6/2016 | Takemura |
| 2004/0261840 A1* | 12/2004 | Schmit ............ H01L 31/022458 136/258 |
| 2005/0268963 A1 | 12/2005 | Jordan |
| 2006/0086620 A1 | 4/2006 | Chase |
| 2006/0204730 A1 | 9/2006 | Nakamura |
| 2009/0120497 A1 | 5/2009 | Schetty |
| 2009/0233083 A1 | 9/2009 | Inoue |
| 2010/0018568 A1 | 1/2010 | Nakata |
| 2010/0132762 A1 | 6/2010 | Graham |
| 2011/0023942 A1 | 2/2011 | Soegding |
| 2012/0031470 A1 | 2/2012 | Dimov |
| 2013/0048062 A1 | 2/2013 | Min |
| 2013/0061913 A1 | 3/2013 | Willham |
| 2013/0209776 A1 | 8/2013 | Kim |
| 2013/0233378 A1 | 9/2013 | Moslehi |
| 2013/0255755 A1 | 10/2013 | Chich |
| 2013/0280521 A1 | 10/2013 | Mori |
| 2014/0124014 A1* | 5/2014 | Morad ................ H01L 31/042 136/246 |
| 2014/0196768 A1 | 7/2014 | Heng et al. |
| 2015/0155824 A1 | 6/2015 | Chien |
| 2015/0194552 A1 | 7/2015 | Ogasahara |
| 2015/0243931 A1 | 8/2015 | Fukuura |
| 2016/0105144 A1* | 4/2016 | Haynes ................ H01L 31/048 136/244 |
| 2017/0033250 A1 | 2/2017 | Ballif |

FOREIGN PATENT DOCUMENTS

| | | |
|---|---|---|
| CN | 102956730 | 6/2016 |
| JP | S57141979 | 9/1982 |
| JP | S6020586 | 2/1985 |
| JP | H06140657 | 5/1994 |
| JP | 2000091610 | 3/2000 |
| JP | 2000216415 | 8/2000 |
| JP | 2013211385 | 10/2013 |
| WO | 2009099418 | 8/2009 |
| WO | 201359441 | 4/2013 |
| WO | 2013067541 | 5/2013 |
| WO | 2013102181 | 7/2013 |
| WO | 2015155356 | 10/2015 |

OTHER PUBLICATIONS

Fan et al., "Laser micromachined wax-covered plastic paper as both sputter deposition shadow masks and deep-ultraviolet patterning masks for polymethylmacrylate-based microfluidic systems" via google scholar, downloaded Mar. 31, 2016.

"An inorganic/organic hybrid coating for low cost metal mounted dye-sensitized solar cells" Vyas, N. et al.

"Recovery Act: Organic Coatings as Encapsulants for Low Cost, High Performance PV Modules" Jim Poole et al. Nov. 16, 2011.

* cited by examiner

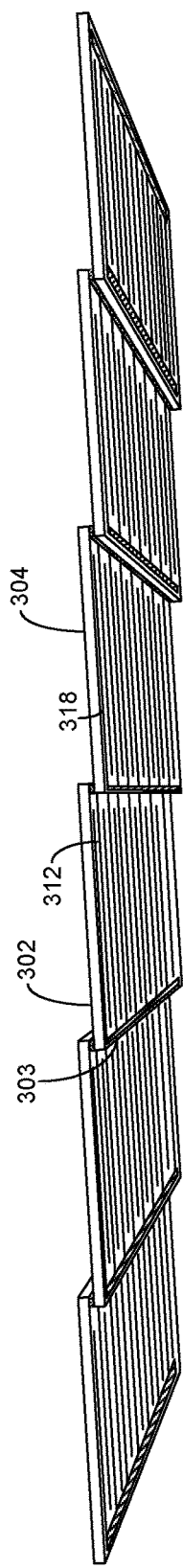
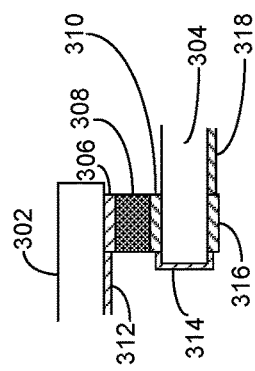
FIG. 3A
FIG. 3B

CASCADED PHOTOVOLTAIC STRUCTURES WITH INTERDIGITATED BACK CONTACTS

FIELD OF THE INVENTION

This relates to solar panel fabrication, including the design of a solar panel having cascaded photovoltaic structures with interdigitated back contacts.

Definitions

"Solar cell" or "cell" is a photovoltaic structure capable of converting light into electricity. A cell may have any size and any shape, and may be created from a variety of materials. For example, a solar cell may be a photovoltaic structure fabricated on a silicon wafer or one or more thin films on a substrate material (e.g., glass, plastic, or any other material capable of supporting the photovoltaic structure), or a combination thereof.

A "solar cell strip," "photovoltaic strip," or "strip" is a portion or segment of a photovoltaic structure, such as a solar cell. A solar cell may be divided into a number of strips. A strip may have any shape and any size. The width and length of a strip may be the same or different from each other. Strips may be formed by further dividing a previously divided strip.

A "cascade" is a physical arrangement of solar cells or strips that are electrically coupled via electrodes on or near their edges. There are many ways to physically connect adjacent photovoltaic structures. One way is to physically overlap them at or near the edges (e.g., one edge on the positive side and another edge on the negative side) of adjacent structures. This overlapping process is sometimes referred to as "shingling." Two or more cascading photovoltaic structures or strips can be referred to as a "cascaded string," or more simply as a string.

"Finger lines," "finger electrodes," and "fingers" refer to elongated, electrically conductive (e.g., metallic) electrodes of a photovoltaic structure for collecting carriers.

A "busbar," "bus line," or "bus electrode" refers to an elongated, electrically conductive (e.g., metallic) electrode of a photovoltaic structure for aggregating current collected by two or more finger lines. A busbar is usually wider than a finger line, and can be deposited or otherwise positioned anywhere on or within the photovoltaic structure. A single photovoltaic structure may have one or more busbars.

A "photovoltaic structure" can refer to a solar cell, a segment, or solar cell strip. A photovoltaic structure is not limited to a device fabricated by a particular method. For example, a photovoltaic structure can be a crystalline silicon-based solar cell, a thin film solar cell, an amorphous silicon-based solar cell, a poly-crystalline silicon-based solar cell, or a strip thereof.

A "front side" of a photovoltaic structure refers to the side of the structure that is typically used to absorb direct sunlight.

A "back side" of a photovoltaic structure refers to the side of the structure that is typically facing away from direct sunlight.

An "emitter" refers to a part of a photovoltaic structure that collects carriers, either holes or electrons. An emitter can also be referred to as a surface field (SF) layer, which can be a back surface field (BSF) layer or a front-surface field (FSF) layer, if such an emitter has the same conductivity type as that of the base layer. In general, a P-type emitter collects holes generated by the solar cell (i.e., it "emits" P-type carrier, or holes, to an external circuit) and an N-type emitter collects electrons (i.e., it "emits" N-type carrier, or electrons, to an external circuit). Hence, a P-type emitter may also be called a hole collector, and an N-type emitter may also be called an electron collector.

RELATED ART

Advances in photovoltaic technology, which are used to make solar panels, have helped solar energy gain mass appeal among those wishing to reduce their carbon footprint and decrease their monthly energy costs. The energy conversion efficiency of photovoltaic structures has always been the focus of solar technology development. The latest photovoltaic structure designs have produced solar cells with efficiencies of 20% or higher, while the pursuit for more efficient devices continues.

FIG. 1 shows an exemplary silicon heterojunction (SHJ) solar cell (prior art). SHJ solar cell 100 can include front grid electrode 102, heavily doped amorphous-silicon (a-Si) emitter layer 104, intrinsic a-Si layer 106, crystalline-Si (c-Si) substrate 108, and back grid electrode 110. Arrows in FIG. 1 indicate direct incident sunlight. Because there is an inherent bandgap offset between a-Si layer 106 and c-Si layer 108, a-Si layer 106 can be used to reduce the surface recombination velocity by creating a barrier for minority carriers. Intrinsic a-Si layer 106 can also passivate the surface of c-Si layer 108 by repairing the existing Si dangling bonds. Moreover, the thickness of heavily doped a-Si emitter layer 104 can be much thinner compared with that of a homojunction solar cell. Thus, SHJ solar cells can provide a higher efficiency with higher open-circuit voltage ($V_{oc}$) and larger short-circuit current ($J_{sc}$). The efficiency of such a solar cell, however, is limited by the amount of shading caused by front-side electrode 102. One approach to address this limitation is to have both P-type and N-type electrodes on the back side of the photovoltaic structure. Nevertheless, this type of configuration can involve complex fabrication steps, and does not allow the solar cell to absorb light from the back side. In addition, these solar cells are often placed side-by-side within a panel. Such a layout can leave gaps between adjacent cells, which in turn can limit the energy-conversion efficiency.

SUMMARY

A solar module is provided that includes a number of photovoltaic structures. Each structure has an interdigitated back contact. The photovoltaic structures are also cascaded, wherein two adjacent structures are electrically coupled by overlapping their edges.

BRIEF DESCRIPTION OF THE FIGURES

FIG. 3A presents an exemplary perspective view that shows a back side of cascaded solar cells with interdigitated back contacts, according to an embodiment of the present invention.

FIG. 3B shows a magnified view of the coupling between two adjacent IBC solar cells, according to an embodiment of the present invention.

In the figures, like reference numerals refer to the same figure elements.

DETAILED DESCRIPTION

Figure 1:
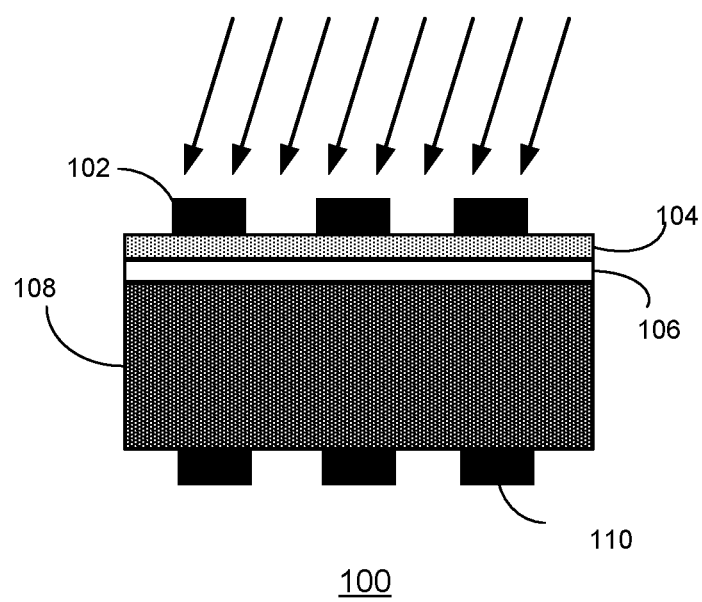
FIG. 1 shows an exemplary silicon hetero junction solar cell (prior art).

The following description is presented to enable any person skilled in the art to make and use the embodiments, and is provided in the context of a particular application and its requirements. Various modifications to the disclosed embodiments will be readily apparent to those skilled in the art, and the general principles defined herein may be applied to other embodiments and applications without departing from the spirit and scope of the present disclosure. Thus, the present invention is not limited to the embodiments shown, but is to be accorded the widest scope consistent with the principles and features disclosed herein.

Overview

Embodiments of the present invention solve the problem of front-side electrode shading on a solar cell and the presence of gaps between solar cells in a module by providing a tunneling-junction solar cell with interdigitated back contacts (IBC) and cascading such solar cells to reduce the size the gaps space between them.

In particular, solar cells with IBC can be coupled with one another in a cascaded or "shingled" manner, such that little or no gap is present between two adjacent cells. Furthermore, the front side of a string of cascaded IBC cells can be free of electrodes and gaps, which increases the area that can absorb light. Note that because both N-type and P-type contacts are on the same side (the back side) of an IBC cell, one type of polarity, either N or P, can be coupled to a front electrode contact, which facilitates the shingling of two adjacent cells.

With respect to the structure of solar cells, an IBC solar cell can include a lightly doped base layer with its front and back sides covered with a thin layer of silicon oxide serving as a quantum-tunneling-barrier (QTB) layer. An electron collector region and hole collector region, often formed in finger-like shapes, form an interdigitated pattern on the back side of the solar cell. Electron-collecting and hole-collecting electrodes can then be formed on the electron collector region and hole collector region, respectively. These electrodes can in turn form the interdigitated back contact (IBC) for the solar cell. The electron collector region can include P-type doped hydrogenated a-Si or conductive oxide (CO) the work function of which has an absolute value within a small range (e.g., 0.1-0.3 eV) near or less than the value of the conduction band edge of the base layer (which can be, for example, lightly-doped c-Si). The hole collector region can include N-type doped a-Si or CO the work function of which has an absolute value within a small range (e.g., 0.1-0.3 eV) near or greater than the value of the valence band edge of the base layer (which can be, for example, lightly-doped c-Si). Using conductive oxide materials with properly tuned work functions (as described above with respect to electron collector and hole collector) can obviate the need of using doped a-Si materials as electron and hole collectors, respectively.

Furthermore, instead of using opaque conductive materials, a transparent conductive material (such as transparent conductive oxide, TCO) can be used to form an ohmic contact layer between the semiconductor structure and the electrode. Using transparent instead of opaque conductive layers can allow the solar cell to operate in a bi-facial mode, wherein light can be absorbed from both the front side and back side. More details on the bi-facial configuration of IBC solar cells are provided below in conjunction with the description for FIG. 5.

To improve passivation, a thin layer of intrinsic a-Si can be positioned between the back side QTB layer and the electron and hole collector regions. In addition, the electrodes can be based on any conductive material (such as copper or other metallic materials) and formed using electroplating, physical vapor deposition, or a combination thereof. Because all electrical connections are on the back side of the solar cell, and because the back side of the cell can now be transparent, the tunneling junction solar cells with IBCs can absorb light from both front and back sides, which results in higher cell efficiency. Moreover, the IBC configuration can facilitate more efficient module fabrication and modules with a higher packing factor, because it is no longer necessary to weave the connecting tabs from one side of a solar cell to the other side of an adjacent solar cell.

Cascaded IBC Solar Cells

Figure 2:
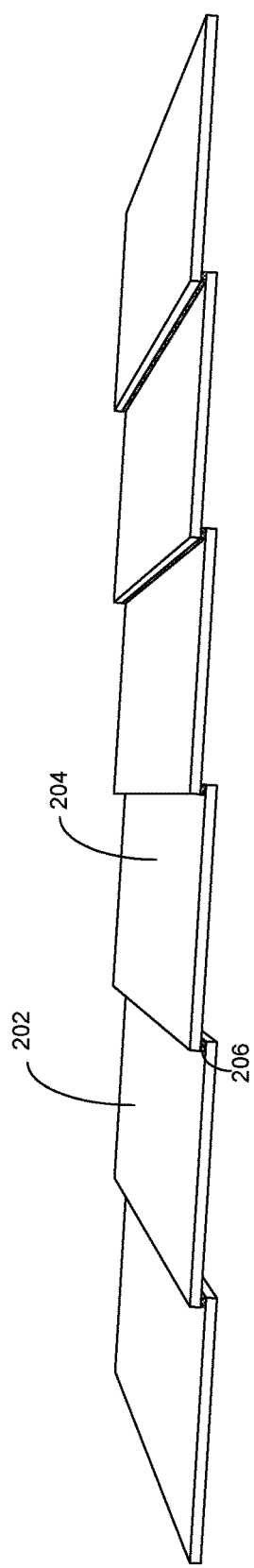
FIG. 2 presents an exemplary perspective view that shows a front side of cascaded solar cells with interdigitated back contacts, according to an embodiment of the present invention.

FIG. 2 presents an exemplary perspective view that shows a front side of cascaded solar cells with interdigitated back contacts, according to an embodiment of the present invention. In this example, a number of IBC solar cells, such as solar cells 202 and 204, are coupled serially to form a string. The perspective view presented in FIG. 2 shows the font side of the cells, hence the upward facing side of the solar cells are free of electrodes and can absorb light without the effect of shading. Furthermore, any two adjacent solar cells are coupled in a shingled manner. That is, the back side of one solar cell is coupled to the front side of the adjacent cell along an edge. Various methods of coupling, for both electrical contact and physical bonding, can be used. For example, as shown in FIG. 2, the coupling between IBC cell 202 and IBC cell 204 can be based on one or more layers of electrically conductive bonding paste 206. Other methods of coupling can include direct physical contact, thermal annealing, pressure-activated bonding, thermally cured paste bonding, etc. More details of various coupling methods can be found in U.S. patent application Ser. No. 14/802,663; U.S. patent application Ser. No. 15/163,543; the disclosures of which are hereby incorporated by reference in their entirety.

FIG. 3A presents an exemplary perspective view that shows a back side of cascaded solar cells with interdigitated back contacts, according to an embodiment of the present invention. In this view, one can see that each IBC solar cell, such as cells 302 and 304, has a number interdigitated back-side electrodes. Specifically, each cell has both P-type and N-type contact electrodes configured in an interdigitated pattern on the back side. For example, cell 302 has P-type finger lines 312, which are coupled to edge busbar 306 on the back side of cell 302 (visible on the magnified view in FIG. 3B). These P-type finger lines are interleaved with the N-type finger lines, which are coupled to N-type busbar 303 on the opposite edge. Note that typically both the P-type and N-type edge busbars are both on the back side of an IBC cell. Therefore, to facilitate a cascaded arrangement of multiple cells, there needs to be one edge busbar on the front side, so that two adjacent cells can be shingled to form a serial connection.

As shown in FIG. 3B, in one embodiment, the N-type (or P-type) back-side busbar can be electrically coupled to a front-side edge busbar. In this example, cell 304 has on its back side N-type finger lines 318 and N-type edge busbar 316. Conductive layer 314, which can be metallic or non-metallic, connects back-side N-type busbar 316 to front-side N-type busbar 310. On the other hand, cell 302 can have on its back side P-type finger lines 312 and P-type busbar 306. P-type back-side busbar 306 of cell 302 can be coupled to N-type front-side busbar 310 of cell 304 by conductive paste layer 308.

Note that using conductive layer 314 to couple back-side busbar 316 to front-side busbar is one of many ways to electrically and mechanically couple the back-side finger lines of a cell to a busbar on the front side. For example, FIG. 3C shows that one or more vias can be used. In this example, via 352 is an opening through the cell, and can be partially or entirely filled or coated with conductive material, such as metal. Via 352 can couple the back-side busbar with the front-side busbar of a single cell. Note that vias are typically of a cylindrical shape, but can be of any shape that is convenient. Therefore, a number of vias along the edge busbar can be used.

Figure 3D:
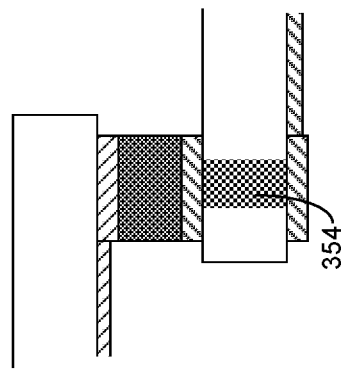
FIG. 3D shows an exemplary configuration where a heavily doped region is used to couple a back-side busbar with a front-side busbar for an IBC solar cell, according to an embodiment of the present invention.
Figure 3C:
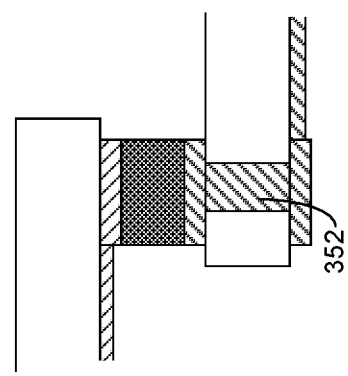
FIG. 3C shows an exemplary configuration where a via is used to couple a back-side busbar with a front-side busbar for an IBC solar cell, according to an embodiment of the present invention.

FIG. 3D shows that a heavily doped region can be used to couple the edge busbar on the back side with the edge busbar on the front side. In this example, heavily doped region 354, which has the same polarity as the corresponding back-side busbar, can be used to facilitate the electrical coupling between the back-side busbar and front-side busbar.

Figure 4A:
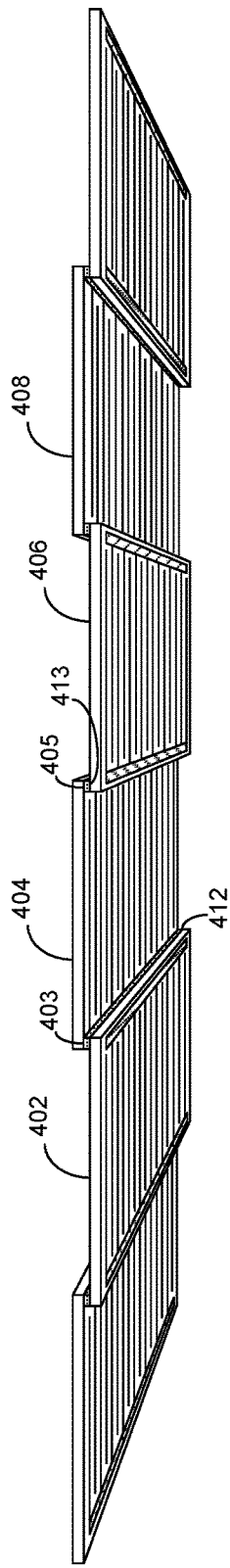
FIG. 4A shows an exemplary configuration to cascade IBC solar cells, according to an embodiment of the present invention.

In addition to the cascading layout shown in FIGS. 2 and 3A, other cascading layouts are also possible. For example, FIG. 4A shows another way to cascade IBC solar cells, according to an embodiment of the present invention. In this example, the cells can be divided into two groups: the bottom cells (such as cells 402 and 406) and top cells (such as cells 404 and 408). The two edges of a given top cell can be stacked above the edges of two adjacent bottom cells. For example, top cell 404 is supported by bottom cells 402 and 406 along both edges. Back-side N-type busbar 403 of cell 404 is coupled to P-type front-side busbar 412 of cell 402. Back-side P-type busbar 405 of cell 404 is coupled to N-type front-side busbar 413 of cell 406. This way, these cells can form a serial connection. Note that each top cell can have both N-type and P-type busbars on the back side, and its front side does not need to have any busbar, because its front side is not used to couple to any adjacent cell. Each bottom cell, on the other hand, has both of its N-type and P-type back-side busbars electrically coupled to the corresponding front-side busbars, so that these front side busbars can couple to the adjacent top cell.

Figure 4B:
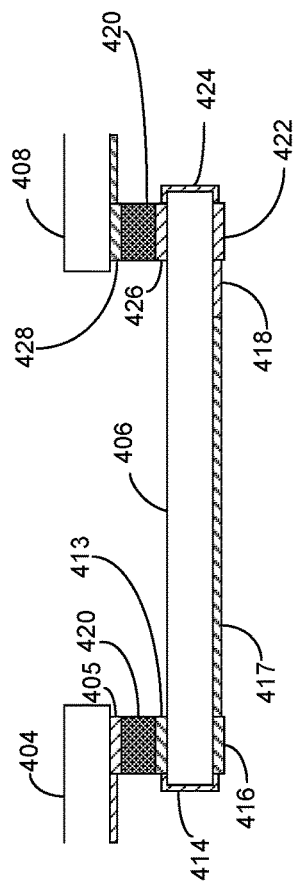
FIG. 4B shows a magnified view of the coupling between top cells and bottom cells cascaded in the manner shown in FIG. 4A, according to an embodiment of the present invention.

FIG. 4B shows a magnified view of the coupling between top cells and bottom cells cascaded in the manner shown in FIG. 4A, according to an embodiment of the present invention. In this example, bottom cell 406 is coupled to top cells 404 and 408 along its respective edges. Bottom cell 406 has on its back side a number of N-type finger lines 417 and corresponding N-type back-side busbar 416. Conductive layer 414 connects back-side busbar 416 to front-side busbar 413, which is coupled to P-type back-side busbar 405 of top cell 404 by conductive paste 420. Because interdigitated N-type and P-type back-side finger lines 417 and 418 of cell 406 are positioned parallel to the viewing surface of FIG. 4B, they might not be easily distinguishable visually (N-type finger lines 417 and P-type finger lines 418 are denoted by hatching lines in opposite directions).

Similarly, conductive layer 424 connects P-type back-side busbar 422 to corresponding front-side busbar 426, which is coupled to N-type back-side busbar 428 of cell 408 by conductive paste 420. Note that the structures shown in FIGS. 3C and 3D can also be used in bottom cell 406 to electrically couple a back-side busbar to the corresponding front-side busbar.

Interdigitated Back Contact (IBC) Solar Cell

Figure 5:
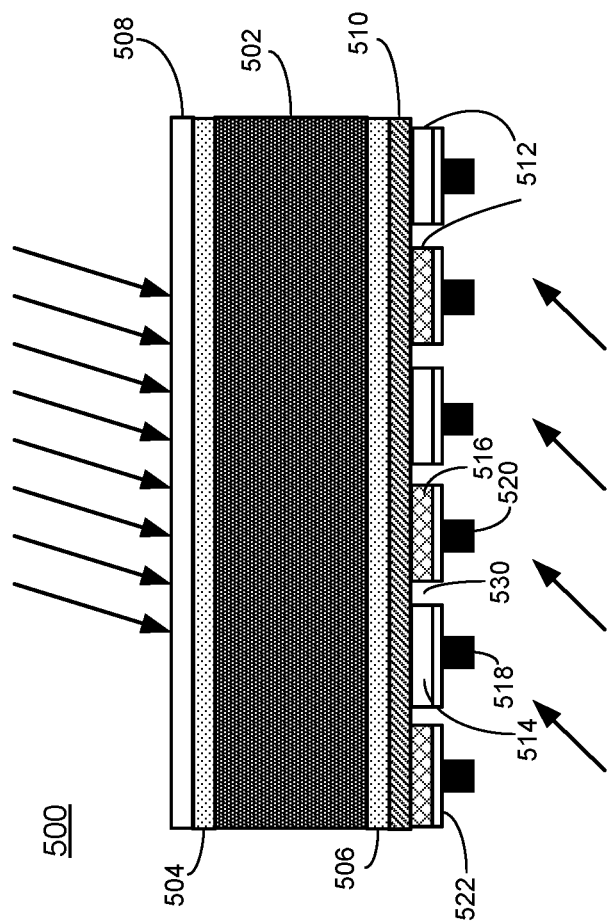
FIG. 5 shows an exemplary IBC solar cell, according to an embodiment of the present invention.

FIG. 5 shows an exemplary IBC solar cell, according to an embodiment of the present invention. Solar cell 500 can include base layer 502, front quantum tunneling barrier (QTB) layer 504, back QTB layer 506, anti-reflection coating (ARC) layer 508, optional intrinsic a-Si layer 510, carrier collector layer 512 that includes electron collectors (also referred to as N-type emitter) and hole collectors (also referred to as P-type emitters) that can form an interdigitated pattern (such as N-type emitter 514 and P-type emitter 516), and a number of electrodes (such as electrodes 518 and 520). The arrows indicate incident light.

Base layer 502 may include a layer of c-Si that is epitaxially grown, for example, or a c-Si wafer cut from an ingot obtained via the Czochralski (CZ) or floating zone (FZ) process, and is lightly doped with either N-type or P-type dopants. The thickness of base layer 502 can be between 80 and 200 µm. In some embodiments, the thickness of base layer 502 is between 80 and 120 µm, which can be an optimized thickness for reducing carrier recombination rate. The resistivity of base layer 302 can be between 1 ohm-cm and 10 ohm-cm. In one embodiment, the resistivity of base layer 502 is between
1 ohm-cm and 5 ohm-cm, which allows for efficient power extraction and yet provides sufficient physical support for the entire device, and the bulk minority carrier lifetime (MCL) is at least 1 ms. In a further embodiment, base layer 502 can be graded-doped with N-type dopants, and can include a textured surface for reducing light reflection and increasing absorption.

QTB layers 504 and 506 can be in direct or indirect contact with base layer 502, and can include a dielectric thin film and/or a layer of wide bandgap semiconductor material with low or no doping. Exemplary materials used for the dielectric thin film include, but are not limited to: silicon oxide (SiO$_x$), hydrogenated SiO$_x$, silicon nitride (SiN$_x$), hydrogenated SiN$_x$, silicon oxynitride (SiON), hydrogenated SiON, aluminum oxide (AlO$_x$ or Al$_2$O$_3$), and aluminum nitride (AlN$_x$). Examples of the wide bandgap materials include, but are not limited to: amorphous Si (a-Si), hydrogenated a-Si, carbon doped a-Si, and silicon carbide (SiC). In one embodiment, back QTB layer 306 can include SiO$_x$, such as SiO or SiO$_2$, and/or hydrogenated SiO$_x$. Front QTB layer 304 can include one or more of: intrinsic a-Si, amorphous SiO, SiO$_x$, SiN$_x$, and Al$_2$O$_3$. The SiO$_x$ or hydrogenated SiO$_x$ layer can be formed using various oxidation techniques, such as submerging the wafer in hot deionized water (DIW), low-pressure radical oxidation, ozone oxygen oxidation, atomic oxygen oxidation, thermal oxidation, chemical oxidation, steam or wet oxidation, atomic layer deposition, ozone bubbling in DIW, and plasma-enhanced chemical-vapor deposition (PECVD). The thickness of QTB layers 504 and 506 can be between 1 and 20 angstroms. In general, a thin QTB layer can have a stronger tunneling effect but is less effective at passivation. A thick QTB layer can have better passivation effect but might reduce cell efficiency due to less tunneling effect. In one embodiment, QTB layers 504 and 506 can each include a SiO$_x$ layer having a thickness approximately between 8 and 15 angstroms to obtain effective passivation and sufficient tunneling effect. In some embodiments, the D$_{it}$ of QTB layers 504 and 506 can be less than $5\times10^{11}$/cm$^2$.

ARC layer 508 can be deposited on front QTB layer 504 to maximize the amount of light absorbed by solar cell 500. In some embodiments, ARC layer 508 can include one or more of: transparent conductive oxide (TCO), SiN$_x$, SiO$_x$, and Al$_x$O$_3$.

Intrinsic a-Si layer 510 can be deposited directly or indirectly on back QTB layer 506. In some embodiments, the thickness of intrinsic a-Si layer 510 can range between 5 Å and 100 Å. In a further embodiment, the thickness of intrinsic a-Si layer 510 can be approximately 10-50 Å, preferably 20-40 Å. Intrinsic a-Si layer 510 can be deposited using a plasma-enhanced chemical-vapor deposition (PECVD) technique. Optional intrinsic a-Si layer 510 can further reduce minority carrier recombination.

Carrier collector layer 512 can include interdigitated-patterned (e.g., interleaved, parallel fingers) P-type emitters and N-type emitters. More specifically, N-type emitters, such as emitter 514, can include P-type doped a-Si, and can be in contact with intrinsic a-Si layer 510. In some embodiments, the N-type emitters can include hydrogenated a-Si with a graded doping profile. If base layer 502 is N-type doped, the N-type emitters can have the opposite electrical conductivity type to base layer 502. The P-type doped a-Si layer, intrinsic a-Si layer 510, QTB layer 506, and base layer 502 together form a hetero tunneling back junction. The doping concentration can determine the contact resistance with the electrode. In addition, a high doping concentration and a thick doped layer can result in higher built-in potential, which in turn can result in stronger tunneling effect. In some embodiments, the N-type emitters (which have an opposite conductivity type to that of N-type doped base layer 502) can have a thickness between 3 and 20 nm and a doping concentration between $1\times10^{15}$/cm$^3$ and $5\times10^{20}$/cm$^3$ to obtain desired ohmic contact resistance and built-in potential.

Similarly, P-type emitters, such as emitter 516, can include N-type doped a-Si, and be in contact with intrinsic a-Si layer 510. In some embodiments, the P-type emitters can include hydrogenated a-Si with a graded doping profile. If base layer 502 is N-type doped, the P-type emitters have the same electrical conductivity type to base layer 502. In some embodiments, the P-type emitters can have a thickness between 1 and 30 nm and a doping concentration between $1\times10^{15}$/cm$^3$ and $5\times10^{20}$/cm$^3$ to obtain desired ohmic contact resistance and built-in potential. The interdigitated pattern can facilitate multiple P-type emitter contacts to the underlying intrinsic a-Si layer 510 and QTB layer 506. The interdigitated pattern of both the N-type and P-type emitters allows adjacent emitters have opposite conductivity doping types. Forming the emitters can involve epitaxially growing doped Si over one or more patterned masks, and hence carefully designed masks can ensure gaps of appropriate size are maintained between the emitters of opposite doping types. This prevents the formation of a short circuit between electrodes of opposite polarities.

Electrodes deposited on the P-type and N-type emitters, such as electrodes 518 and 520, provide electrical coupling to the emitters. The electrodes can be made of metallic or non-metallic materials. As shown in FIG. 5, there can be gaps between adjacent emitters of opposite doping types to ensure that the electrodes are not shorted. For example, P-type emitter 514 and N-type emitter 516 are separated by gap 530, which helps ensure that electrodes 518 and 520 are sufficiently electrically isolated from each other.

In some embodiments, conductive oxide (CO) layer 522 can be formed between carrier collector layer 512 and the electrode metallic layer. CO layer 522 can facilitate the formation of good ohmic contact to the P-type and N-type emitters. In some embodiments, CO layer 522 can include one or more transparent conductive oxide (TCO) materials. As a result, the back side of solar cell 500 can be transparent, either entirely or partially, in areas not covered by the electrodes. Using TCO allows solar cell 500 to receive and absorb light incident on its back side, which in turn allows solar cell 500 to operate in a bi-facial mode.

CO layer 522 can be deposited, for example, using one or more of the following techniques: plasma vapor deposition, thermal evaporation, ion plating, and remote plasma deposition. The electrode layer can be deposited on CO layer 522 or directly on the P-type or N-type doped a-Si. In some embodiments, the electrode layer is electrically conductive, and can include one or more layers of metal, such as Cu, Ag, Ni, etc. Various techniques, including but not limited to: physical vapor deposition (PVD), screen printing, evaporating, inkjet printing, aerosol printing, electro- or electroless plating with patterning can be used to deposit the one or more metallic layers. In one embodiment, the metallic electrodes can include copper, and can be formed using an electroplating technique. In a further embodiment, a seed layer of copper can be deposited using a PVD process, and bulk copper can be formed on the seed layer using an electroplating process. More details on how to form an electroplated metal grid on a photovoltaic structure can be found in U.S. patent application Ser. No. 13/220,532, entitled "SOLAR CELL WITH ELECTROPLATED METAL GRID," by inventors Jianming Fu, Zheng Xu, Chentao Yu, and Jiunn Benjamin Heng, the disclosure of which is hereby incorporated by reference in its entirety herein.

Figure 6:
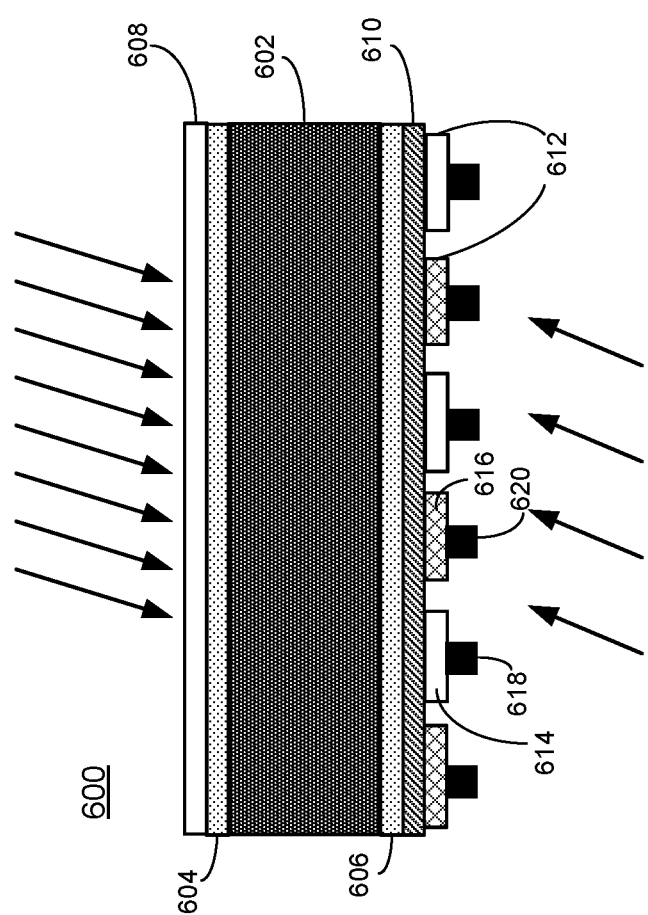
FIG. 6 shows an exemplary TIBC solar cell, according to an embodiment of the present invention.

Instead of using a-Si based emitters the N-type or P-type emitters can be formed using CO materials (which can be transparent or opaque), without using any doped a-Si material. FIG. 6 shows an exemplary TIBC solar cell according an embodiment of the present invention. Solar cell 600 can include base layer 602, front QTB layer 604, back QTB layer 606, anti-reflection coating (ARC) layer 608, optional intrinsic a-Si layer 610, CO layer 612. CO layer 612 can include high work function CO regions (e.g., a work function that is approximately within 0.1-0.3 eV near or greater than the value of the valence band edge of base layer 602) that function as hole collectors and low work function CO regions that function as electron collectors. These two CO regions of different work functions form the interdigitated pattern (such as low work function CO region 614 (electron collector) and high work function CO region 616 (hole collector)). A number of metallic electrodes (such as metallic electrodes 618 and 620) can be formed on CO layer 642.

Base layer 602, front and back QTB layers 604 and 606, ARC layer 608, and intrinsic a-Si layer 610 can be similar to base layer 502, front and back QTB layers 504 and 506, ARC layer 508, and intrinsic a-Si layer 510, respectively. However, instead of graded doped a-Si, CO layer 612 (which can include two types of CO materials deposited in two or more steps) can be deposited onto and in direct contact with intrinsic a-Si layer 610 or back QTB layer 606 (if a-Si layer 610 is not present). As shown in FIG. 6, CO layer 612 includes low work function CO regions (e.g., with a work function that is approximately within 0.1-0.3 eV near or less than the value of the conduction band edge of base layer 602), such as CO region 614, and high work function CO regions (e.g., with a work function that is approximately within 0.1-0.3 eV near or greater than the value of the valence band edge of base layer 602), such as CO region 616. Both the high work function CO regions and low work function CO regions can be interleaved in an interdigitated pattern. Metallic electrodes 618 and 620 can be similar to metallic electrodes 518 and 520.

As mentioned above, to collect holes, instead of using N-type doped a-Si, a high work function CO material can be used. Ideally, this high work function CO material has a work function whose absolute value is within a small range (e.g., 0.3 eV) near or greater than the value of the valence band edge, $E_v$, of the c-Si (lightly doped or intrinsic) used in base layer 602, which is approximately 5.17 eV, for example. When interfaced with c-Si base layer 602, this high work function CO region (such as CO region 616) can create a built-in electrical field that can draw the holes away from base layer 602 where carriers (i.e., both electrons and holes) are generated. Because the CO material's work function is relatively large, the potential difference at this interface is large enough to cause the holes to tunnel through back side QTB layer 606. If base layer 602 is N-type doped, this high work function CO layer can function as a surface field region, because it attracts minority carriers (e.g., holes). If base layer 603 is P-type doped, this high work function CO layer can function as an emitter region, because it attracts majority carriers (e.g., holes).

Similarly, to collect electrons, instead of using P-type doped a-Si, a low work function CO material can be used. Ideally, this low work function CO material has a work function whose absolute value is within a small range (e.g., 0.1 eV to 0.3 eV) near or less than the value of the conduction band edge of the c-Si (lightly doped or intrinsic) used in base layer 602. When interfaced with c-Si base layer 602, this low work function CO region (such as CO region 614) can create a built-in electrical field that can draw the electrons away from base layer 602. Because the CO material's work function is small enough, the potential difference at this interface is large enough to cause the electrons to tunnel through back side QTB layer 606. If base layer 602 is N-type doped, this low work function CO layer can function as an emitter, because it attracts majority carriers (e.g., electrons). If base layer 602 is P-type doped, this low work function CO layer can function as a surface field region, because it attracts minority carriers (e.g., electrons).

Furthermore, because of the passivation effect of intrinsic a-Si layer 610, the CO film can be formed with a low interface defect density. In one embodiment, the interface defect density ($D_{it}$) can be less than $1e^{11}/cm^2$, which makes it possible to eliminate the Fermi-level pinning effect at the CO— semiconductor interface. The Fermi-level pinning effect can be caused by the surface states associated with the defects and would make energy band bending nearly impossible on the semiconductor side. As a result of Fermi-level pinning, the Schottky barrier height can be insensitive to the conductor's (which in this case is the CO material) work function. Because of the low interface defect density resulting from intrinsic a-Si layer 610, the carrier transportation property can now be manipulated based on Fermi level of the CO layer. Consequently, the degenerated carrier distribution in the CO layer with an appropriate work function and the low $D_{it}$ make it possible to have a strong tunneling effect when the CO/intrinsic a-Si/QTB structure is in contact with a lightly doped c-Si base. The tunneling process can depend on the available carrier concentration at the starting side (the c-Si side) and the density of states at the receiving side (the CO side), according to the Wentzel-Kramers-Brillouin (WKB) approximation.

In one embodiment, when CO materials with different work functions are used as electron and hole collectors instead of P-type and N-type doped a-Si, the CO materials can be transparent, opaque, or partially transparent. In one embodiment, the high work function and low work function CO materials are transparent (i.e., both are TCO materials). As a result, the solar cell can absorb light from both the front and back sides. Such solar cells can then be used to build bi-facial solar panels, which can produce more energy than conventional single-sided solar panels.

Although the exemplary device structures shown in FIGS. 5 and 6 have both front and back QTB layers, an IBC solar cell can have only the front or back QTB layer, or have no QTB layer at all. In addition, the shingling configuration shown in FIGS. 2, 3A-3D, 4A, and 4B, as well as the side-by-side configuration shown in FIGS. 8B and 8C (described in more detail below) can also apply to IBC solar cells with two (front and back) QTB layers, one (front or back) QTB layer, or no QTB layer.

Figure 7:
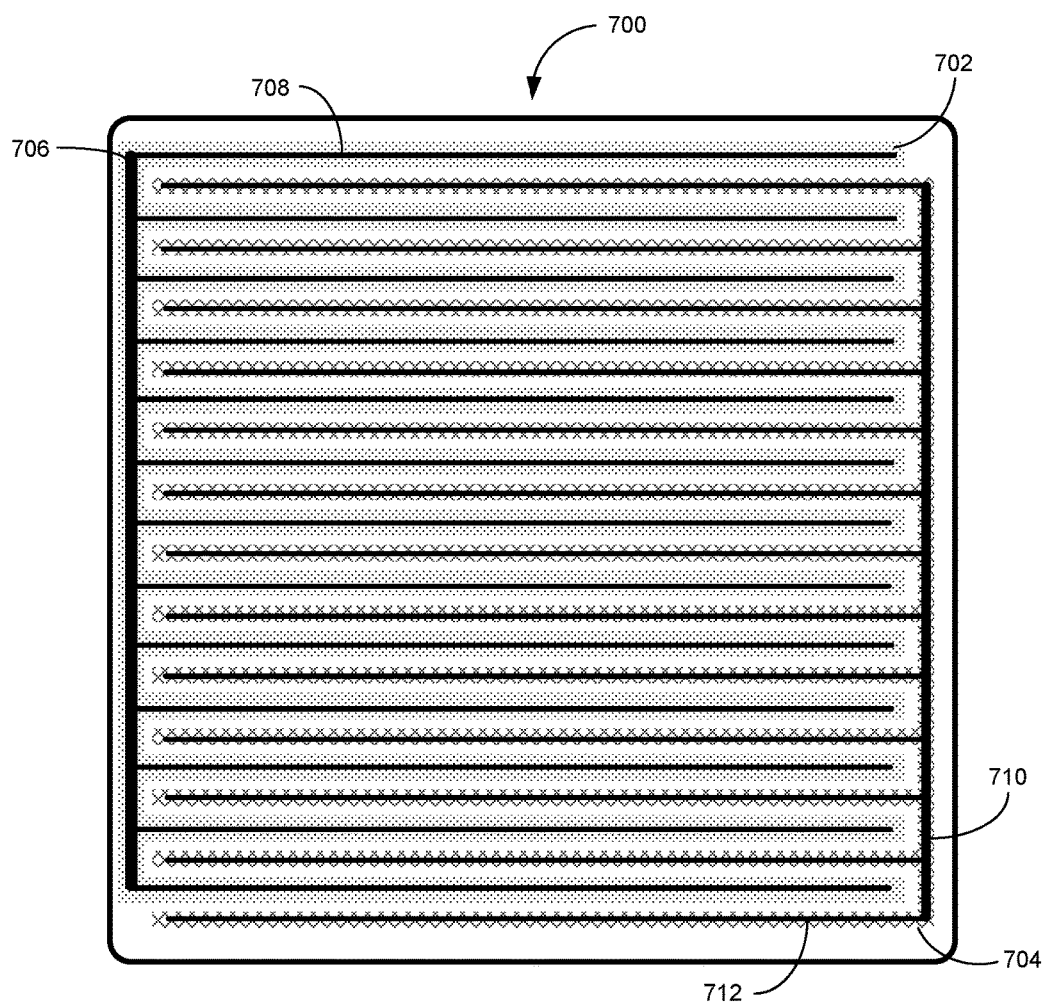
FIG. 7 shows an exemplary layout of a IBC solar cell, according to an embodiment of the present invention.

FIG. 7 shows an exemplary IBC solar cell layout according to one embodiment of the present invention. In this example, solar cell 700 has a lightly N-type doped c-Si base layer, and on the back side there are two regions: a high work function TCO region 702 (shown in dotted pattern) as a hole collector and a low work function TCO region 704 (shown in cross-hatched pattern) as an electron collector. Both regions are configured in a finger-line pattern, and the fingers are interleaved, forming an interdigitated pattern. Metallic or otherwise electrically conductive electrodes, such as electrodes 708 and 712, can be formed on each region, respectively. In one embodiment, the width of each electrode can be less than the width of the corresponding TCO finger to reduce shading. The width and physical arrangement of the electrodes can also vary on a single cell. In each region (i.e., the electron collector region or hole collector region), the metallic finger lines are connected with a busbar, which is placed near an edge of the solar cell. Because of the transparent nature of TCO, and because the metallic electrodes only cover a portion of the back side, light can pass through the back side and reach the base layer, thereby allowing solar cell to operate in a bi-facial mode.

In a further embodiment, the electron collector and hole collector can be formed using opaque CO materials with different work functions. Alternatively, the electron collector and hole collector can be formed using P-type doped a-Si and N-type doped a-Si, respectively. These two regions can then be covered by the same transparent or opaque CO material.

Figure 8A:
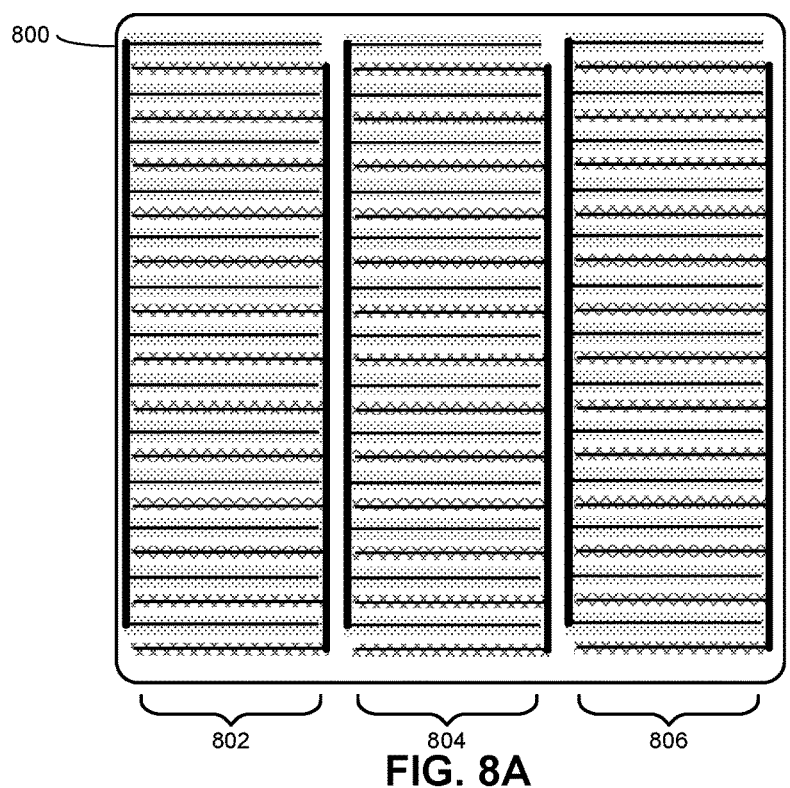
FIG. 8A shows an exemplary layout of a IBC solar cell, according to an embodiment of the present invention.

FIG. 8A shows another IBC solar cell layout according to an embodiment of the present invention. In this example, conventional square or pseudo square shaped cell 800 can be divided into three strips 802, 804, and 806. Each strip has an IBC configuration similar to that of solar cell 700 shown in FIG. 7. In one embodiment, multiple strips can be cascaded into a string, which can have the same output voltage as a conventional solar panel that has the square or pseudo square shaped solar cells connected in series in a single string. Multiple cascaded strings can then be connected in parallel, for example, within a single panel. Consequently, the total internal resistance of the entire solar panel can be significantly reduced, and the panel's output power can be increased correspondingly. More details of such cascaded (also referred to as "shingled") configuration can be found in U.S. patent application Ser. No. 14/563,867, entitled "HIGH EFFICIENCY SOLAR PANEL," by inventors Bobby Yang, Peter P. Nguyen, Jiunn Benjamin Heng, Anand J. Reddy, and Zheng Xu, the disclosure of which is hereby incorporated by reference herein in its entirety.

Figure 8B:
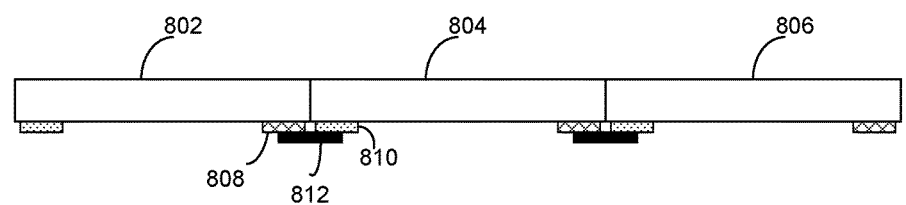
FIG. 8B shows an exemplary configuration of IBC solar cell strips, according to an embodiment of the present invention.
Figure 8C:
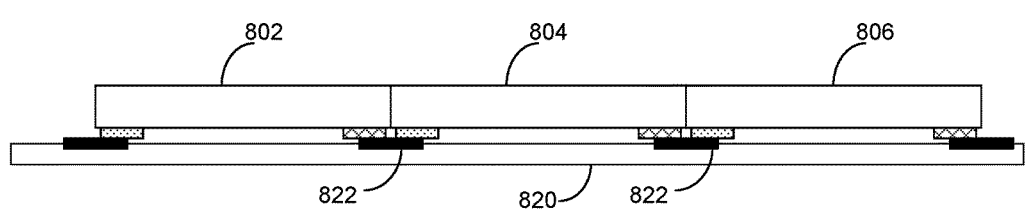
FIG. 8C shows an exemplary configuration of IBC solar cell strips, according to an embodiment of the present invention.

FIG. 8B shows another exemplary configuration of solar cell strips with IBC, according to one embodiment of the present invention. In this example, three strips 802, 804, and 806 are positioned side by side and electrically coupled in series along their long edges. Because each strip's busbars are both on the back side, and the busbars of opposite polarity are positioned on opposing edges, the strips can be placed next to each other, and the adjacent busbars from two neighboring strips are of opposite polarities. For example, positive busbar 808 of strip 802 can be placed next to negative busbar 810 of strip 804. In one embodiment, metallic tab 812 can be used to connect busbars 808 and 810, thereby forming a series connection between strip 802 and 804. The strips can be placed close to each other to reduce the gap between them. Other methods can also be used to connect two adjacent busbars. For example, a conductive adhesive paste can be applied on busbars 808 and 810 to connect them. Furthermore, as shown in FIG. 8C, a circuit embedded in the back sheet of a solar module can also be used to electrically couple two side-by-side IBC solar strips. In this example, back sheet 820 can include a number of embedded circuits 822. When the IBC strips are positioned on back sheet 820, the busbars of opposite polarities of two adjacent strips can be placed on a respective circuit, which can electrically couple the two neighboring strips in series. Circuit 822 can be any conductive material, and can be metallic or non-metallic. In addition, a conductive paste can be used between circuit 822 and the busbars to strengthen the physical bond and/or improve the ohmic contact.

Panel Configuration

Figure 9:
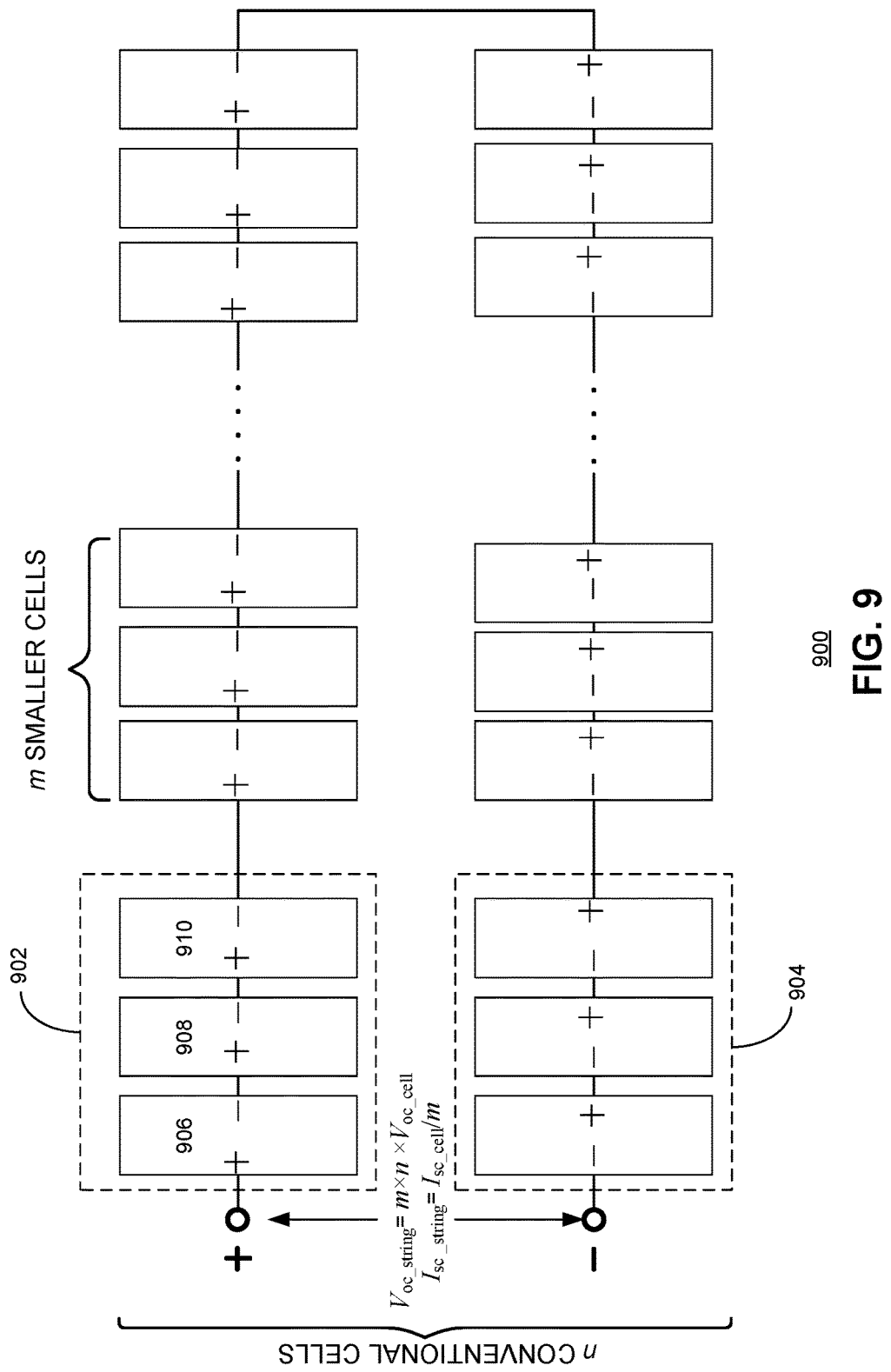
FIG. 9 shows an exemplary solar cell string with each solar cell being divided into multiple smaller strips, according to an embodiment of the present invention.

FIG. 9 shows a solar cell string with each conventional solar cell being divided into multiple smaller strips, according to embodiment of the present invention. In the example shown in FIG. 9, a solar cell string 900 includes a number of smaller strips. A conventional solar cell (such as the one represented by dotted line 902) is replaced by a number of serially connected smaller strips, such as strips 906, 908, and 910. For example, if the conventional solar cell is a 6-inch square cell, each smaller strip can have a dimension of 2-inch by 6-inch, and a conventional 6-inch square cell is replaced by three 2-inch by 6-inch smaller strips connected in series. As long as the layer structure of the smaller strips remains substantially the same as the conventional square-sized solar cell, the smaller strip will have the same open-circuit voltage $V_{oc}$ as that of the undivided solar cell. On the other hand, the current generated by each smaller strip is only a fraction of that of the original undivided cell due to its reduced size. Furthermore, the output current by solar cell string 900 is a fraction of the output current by a conventional solar cell string with undivided cells. The output voltage of the solar cell strings is now three times that of a solar string with undivided cells, thus making it possible to have parallelly connected strings without sacrificing the output voltage.

Now assuming that the open circuit voltage ($V_{oc}$) across a standard 6-inch solar cell is $V_{oc\_cell}$ cell, then the $V_{oc}$ of each string is m×n $V_{oc\_cell}$, wherein m is the number of smaller strips as the result of dividing a conventional square shaped cell, and n is the number of conventional cells included in each string. On the other hand, assuming that the short circuit current ($I_{sc}$) for the standard 6-inch solar cell is $I_{oc\_cell}$, then the $I_{sc}$ of each string is $I_{sc\_cell}$/m. Hence, when m such strings are connected in parallel in a new panel configuration, the $V_{oc}$ for the entire panel can be the same as the $V_{oc}$ for each string, and the $I_{sc}$ for the entire panel will be the sum of the $I_{sc}$ of all strings. More specifically, with such an arrangement, one can achieve: $V_{oc\_panel}$=m×n× $V_{oc\_cell}$ and $I_{sc\_panel}$=$I_{sc\_cell}$. This means that the output voltage and current of this new solar panel will be comparable to the output voltage and current of a more conventional solar panel of a similar size but with undivided solar cells all connected in series. The similar voltage and current outputs make this new panel compatible with other devices, such as inverters, that are used by a conventional solar panel with all its undivided cells connected in series. Although having similar current and voltage output, the new solar panel can extract more output power to external load because of the reduced total internal resistance.

Figure 10:
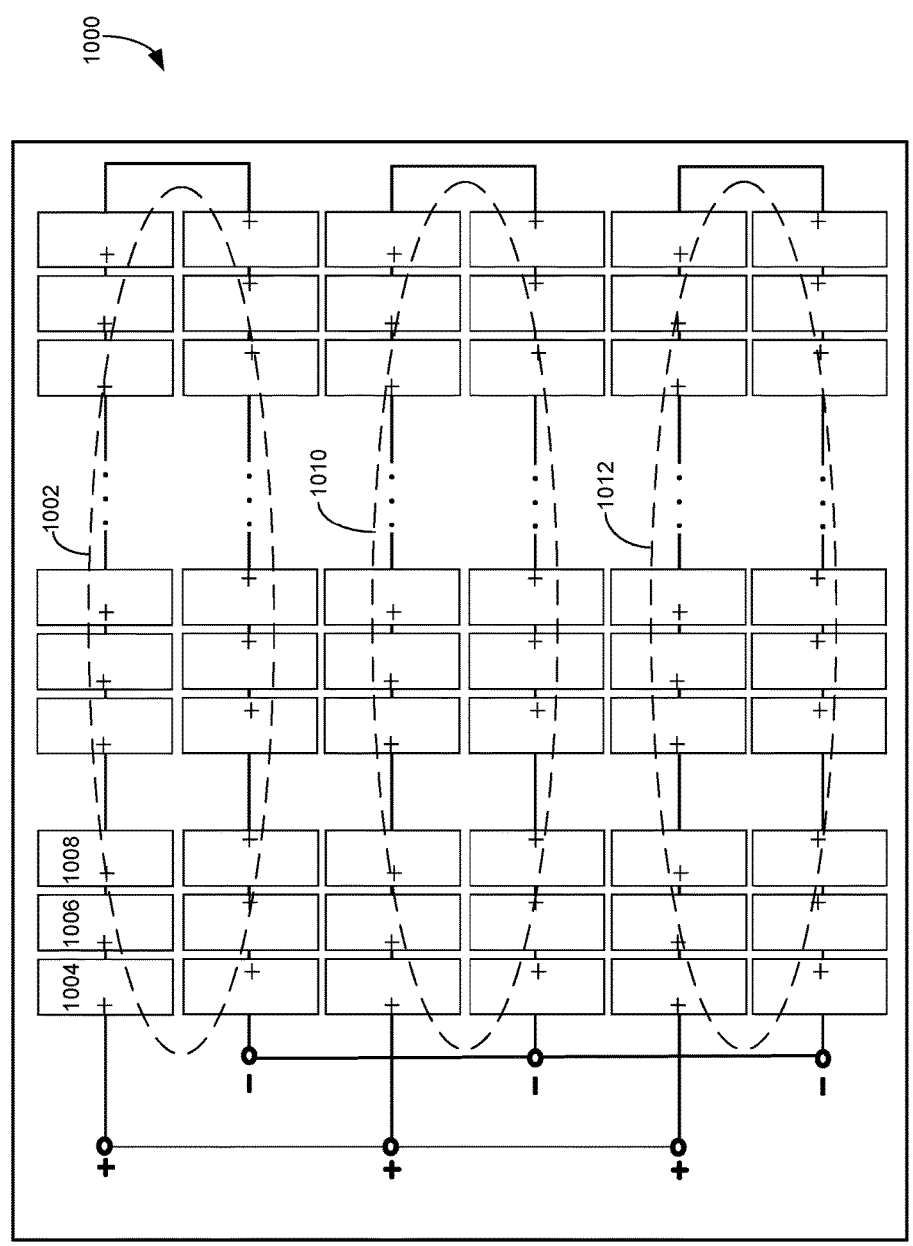
FIG. 10 shows an exemplary solar panel, according to an embodiment of the present invention.

FIG. 10 shows an exemplary solar panel, according to an embodiment of the present invention. In this example, solar panel 1000 can include arrays of solar cells that are arranged in a repeated pattern, such as a matrix that includes a plurality of rows. In some embodiments, solar panel 1000 can include six rows of inter-connected strips, with each row including 36 smaller strips. Note that each smaller strip can be approximately ⅓ of a 6-inch standardized solar cell. For example, strips 1004, 1006, and 1008 are evenly divided portions of a standard-sized cell. Solar panel 1000 is configured in such a way that every two adjacent rows of strips are connected in series, forming three U-shaped strings. In FIG. 10, the top two rows of strips are connected in series to form a solar string 1002, the middle two rows of strips are connected in series to form a solar string 1010, and the bottom two rows of strips are connected in series to form a solar string 1012.

In the example shown in FIG. 10, solar panel 1000 includes three U-shaped strings with each string including 72 strips. The $V_{oc}$ and $I_{sc}$ of the string are 72$V_{oc\_cell}$ and $I_{sc\_cell}$/3, respectively; and the $V_{oc}$ and $I_{sc}$ of the panel are 72$V_{oc\_cell}$ and $I_{sc\_cell}$, respectively. Such panel level $V_{oc}$ and $I_{sc}$ are similar to those of a conventional solar panel of the same size with all its 72 cells connected in series, making it possible to adopt the same circuit equipment developed for the conventional panels.

Furthermore, the total internal resistance of panel 1000 is significantly reduced. Assume that the internal resistance of a conventional cell is $R_{cell}$. The internal resistance of a smaller strip is $R_{small\_cell}=R_{cell}/3$. In a conventional panel with 72 conventional cells connected in series, the total internal resistance is 72 $R_{cell}$. In panel 1000 as illustrated in FIG. 10, each string has a total internal resistance $R_{string}=72\ R_{small\_cell}=24\ R_{cell}$. Since panel 1000 has 3 U-shaped strings connected in parallel, the total internal resistance for panel 1000 is $R_{string}/3=8\ R_{cell}$, which is 1/9 of the total internal resistance of a conventional panel. As a result, the amount of power that can be extracted to external load can be significantly increased.

In the example shown in FIG. 10, the circuitry for interconnecting strings 1002, 1010, and 1012 can be a standalone circuit enclosed between the back sheet and front cover of a solar module, or a circuit that is embedded into the back sheet.

Figure 11:
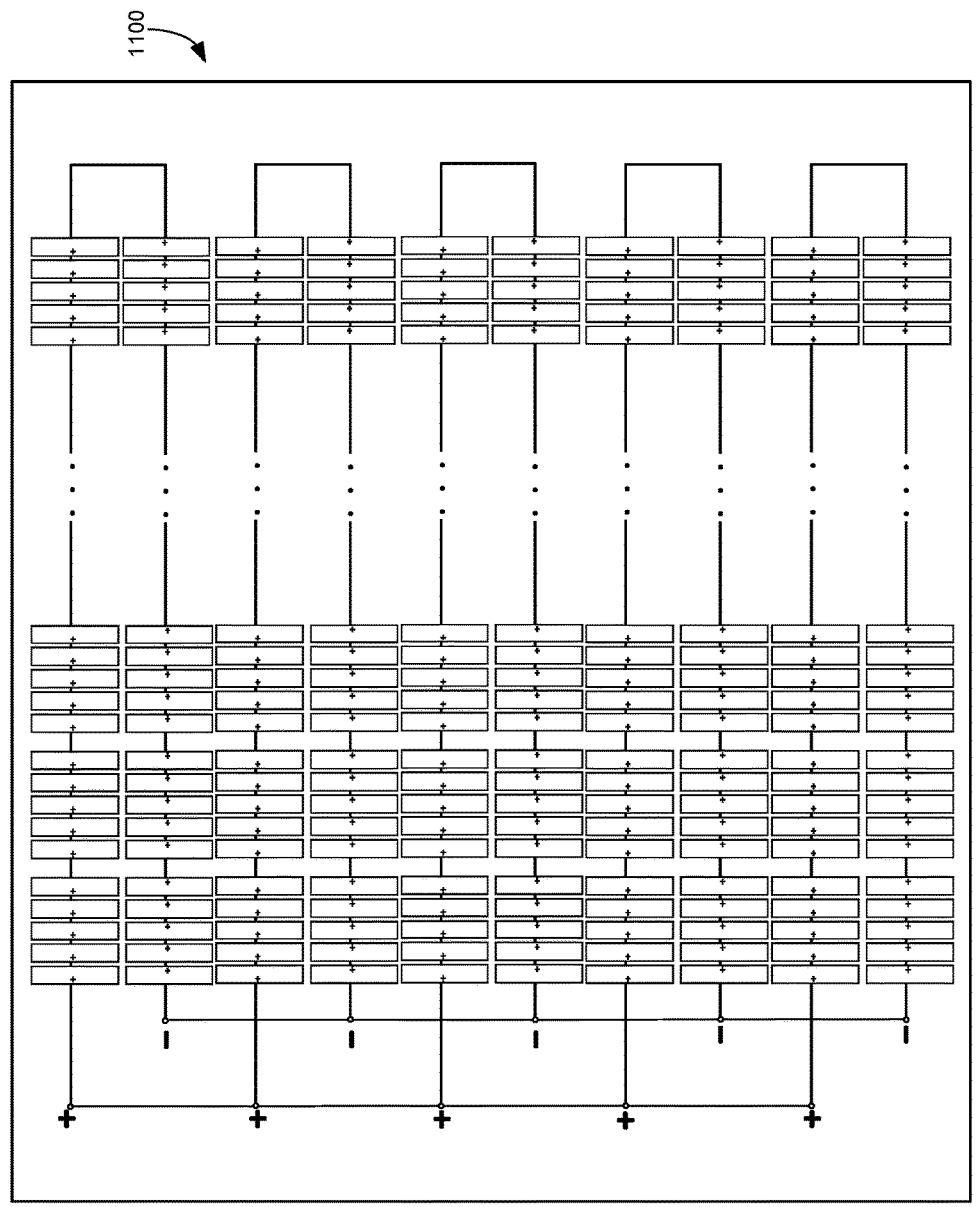
FIG. 11 shows another exemplary solar panel, according to an embodiment of the present invention.

Other configurations of the strip size and number of strings can also be used. For example, each strip can be 1/3, 1/4, 1/5, or other fraction of a conventional-sized solar cell. Correspondingly, a solar cell can be scribed and cleaved into the properly sized strips with an automated tool. The strips can then be shingled into strings. FIG. 11 shows another exemplary solar panel, according to an embodiment of the present invention. In this example, solar panel 1100 can include ten rows of strips, which are connected into five strings. Each row can include 36 smaller strips. Note that each strip can be approximately 1/5 of a 6-inch standardized solar cell. Every two adjacent rows of strips can be connected in series, forming five U-shaped strings.

In the example shown in FIG. 11, solar panel 1100 includes five U-shaped strings with each string including 72 strips. The $V_{oc}$ and $I_{sc}$ of the string are $72V_{oc\_cell}$ and $I_{sc\_cell}/5$, respectively; and the $V_{oc}$ and $I_{sc}$ of the panel are $72V_{oc\_cell}$, and $I_{sc\_cell}$, respectively. Such panel level $V_{oc}$ and $I_{sc}$ are similar to those of a conventional solar panel of the same size with all its 72 cells connected in series, making it possible to adopt the same circuit equipment developed for the conventional panels.

Furthermore, the total internal resistance of panel 1100 is significantly reduced. Assume that the internal resistance of a conventional cell is $R_{cell}$. The internal resistance of a smaller strip is $R_{small\_cell}=R_{cell}/5$. In a conventional panel with 72 conventional cells connected in series, the total internal resistance is 72 $R_{cell}$. In panel 1100, each string has a total internal resistance $R_{string}=72\ R_{small\_cell}=14.4\ R_{cell}$. Since panel 1100 has 5 U-shaped strings connected in parallel, the total internal resistance for panel 1100 is $R_{string}/5=2.88\ R_{cell}$, which is 1/25 of the total internal resistance of a conventional panel. As a result, the amount of power that can be extracted to external load can be significantly increased.

The foregoing descriptions of various embodiments have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention.

What is claimed is:

1. A solar module, comprising:
    a plurality of photovoltaic structures, each having a front side, a back side, and an interdigitated back contact;
    wherein each photovoltaic structure comprises a first edge and a second edge opposite to the first edge;
    wherein the plurality of photovoltaic structures include first, second, and third structures, wherein the second structure is adjacent to and positioned between the first and third structures;
    wherein each of the first and third structures comprises:
        first and second front edge busbars positioned on the first and second edges, respectively, of the front side of the structure, and
        first and second back edge busbars positioned on the first and second edges, respectively, of the back side of the structure; and
    wherein the first and second edges of the second structure are coupled with and positioned above the second edge of the first structure and first edge of the third structure, respectively.

2. The solar module of claim 1, wherein the first front edge busbar is electrically coupled to the first back edge busbar; and
    wherein the second front edge busbar is electrically coupled to the second back busbar.

3. The solar module of claim 2, wherein the first front edge busbar is electrically coupled the first back edge busbar using a via or a heavily doped region internal to the first or third structure.

4. The solar module of claim 1, wherein the first and second structures are electrically and mechanically coupled by a conductive paste.

5. The solar module of claim 1,
    wherein the second photovoltaic structure comprises a first edge busbar near the first edge of the back side and a second edge busbar near the second edge of the back side.

6. The solar module of claim 5, wherein the first structure and second structure are electrically coupled to each other by overlapping the second front edge busbar of the first structure with the first edge busbar of the second structure.

7. The solar module of claim 5, wherein the third structure and second structure are electrically coupled to each other by overlapping the first front edge busbar of the third structure with the second edge busbar of the second structure.

8. The solar module of claim 1, wherein the third and second structures are electrically and mechanically coupled by a conductive paste.

9. A solar cell, comprising:
    a semiconductor structure having a front side and a back side;
    a back contact located on the back side of the structure, wherein the contact comprises:
        a first plurality of finger lines having a first polarity;
        a second plurality of finger lines having a second polarity that is opposite the first polarity, wherein the first and second pluralities of finger lines are interdigitated;
        a first back edge busbar positioned on a first edge of the back side of the structure and electrically connected to the first plurality of finger lines; and
        a second back edge busbar positioned on a second edge of the back side of the structure and electrically connected to the second plurality of finger lines;
    a first front edge busbar located on the first edge of the front side of the structure, wherein the first front edge busbar is electrically coupled to the first back edge busbar; and
    a second front busbar located on the second edge of the front side of the structure, wherein the second front edge busbar is electrically coupled to the second back edge busbar.

10. The solar cell of claim 9, wherein the first or second front edge busbar is coupled to the first or second back edge busbar, respectively, using one or more vias.

11. The solar cell of claim 9, wherein the first or second front edge busbar is coupled to the first or second back edge busbar, respectively, using one or more heavily doped regions internal to the semiconductor structure.

\* \* \* \* \*